United States Patent [19]

Honda

[11] Patent Number: 4,580,157
[45] Date of Patent: Apr. 1, 1986

[54] SEMICONDUCTOR DEVICE HAVING A SOFT-ERROR PREVENTING STRUCTURE

[75] Inventor: Norio Honda, Aizuwakamatsu, Japan

[73] Assignee: Fujitsu Limited, Kawasaki, Japan

[21] Appl. No.: 469,833

[22] Filed: Mar. 2, 1983

Related U.S. Application Data

[63] Continuation of Ser. No. 157,851, Jun. 9, 1980, abandoned.

[30] Foreign Application Priority Data

Jun. 8, 1979 [JP] Japan .................................. 54-71900

[51] Int. Cl.⁴ ..................... H01L 23/14; H01L 27/04; G11C 11/40
[52] U.S. Cl. ..................................... 357/84; 357/23.6; 357/29; 357/74; 357/81
[58] Field of Search ..................... 357/29, 84, 23.6, 74, 357/81

[56] References Cited

U.S. PATENT DOCUMENTS

| | | | |
|---|---|---|---|
| 3,257,588 | 6/1966 | Mueller | 357/84 |
| 3,614,546 | 10/1971 | Avins | 357/84 |
| 3,710,204 | 1/1973 | Batz | 357/53 |
| 3,715,638 | 2/1973 | Polye | 357/84 |
| 3,946,428 | 3/1976 | Anazawa | 357/84 |
| 4,107,555 | 8/1978 | Haas et al. | 357/84 |
| 4,121,240 | 10/1978 | Katto | 357/84 |
| 4,177,480 | 12/1979 | Hintzmann | 357/84 |
| 4,266,239 | 5/1981 | Miyagaki et al. | 357/84 |
| 4,323,405 | 4/1982 | Und et al. | 357/84 |

FOREIGN PATENT DOCUMENTS

| | | | |
|---|---|---|---|
| 950592 | 2/1964 | United Kingdom | 357/84 |
| 1204805 | 9/1970 | United Kingdom | 357/53 |

OTHER PUBLICATIONS

Technical Notes; Radiation Shielding of Electronic Components; by Schenk et al, Jun. 11, 1975.
Packaging; MOS/LSI Plastic Package for 20 Cents, Electronics, Dec. 6, 1971, p. 40.

Primary Examiner—William D. Larkins
Attorney, Agent, or Firm—Staas & Halsey

[57] ABSTRACT

In a semiconductor device, particularly a memory device, radioactive rays emitted from the ceramic material of the package enclosing the LSI chip of the device detrimentally influence the electrical properties of the device. In the memory device, the information is destroyed by the radioactive ray emission, which is referred to as a soft error. In the present invention, a shield plate having a shielding effect against radioactive rays is arranged in the space defined by a cover and a carrier. Thus, the radioactive rays emitted from the cover and carrier are blocked by the shielding plate, preferably made of high purity silicon, as well as by the silicon substrate of the LSI chip.

9 Claims, 4 Drawing Figures

SEMICONDUCTOR DEVICE HAVING A SOFT-ERROR PREVENTING STRUCTURE

This is a continuation of Ser. No. 157,851, filed June 9, 1980, now abandoned.

BACKGROUND OF THE INVENTION

1. Field of the Invention

The present invention relates to a semiconductor device, particularly the structure of a semiconductor device suitable for preventing a soft error.

2. Description of the Prior Art

The term semiconductor device used herein collectively indicates a package, an LSI or IC chip mounted in the package and semiconductor elements, such as transistors and resistors, fabricated in the LSI or IC chip. Usually, the package is made of an insulating ceramic material and comprises a carrier, which is adapted to receive the LSI or IC chip, and a cover, which hermetically encloses the LSI or IC chip within the space of the carrier. The LSI or IC chip, hereinafter referred to simply as an LSI chip, is connected via wires to conductor leads formed on the carrier, which in turn are connected to an electronic device, such as a power source, located outside the semiconductor device.

A semiconductor device is described in, for example, U.S. Pat. No. 3,872,583.

It is known that the ceramic material of the package emits radioactive rays, particularly $\alpha$ rays which destroy memory data stored in the memory cells, i.e. one of the semiconductor elements of the LSI chip. The ceramic material of the package contains a few ppm of uranium and thorium, and the $\alpha$ rays are emitted in the radioactive disintegration of the uranium and thorium. When the $\alpha$ rays are transmitted through the memory cells formed at the surface of the semiconductor chip, a number of electron-hole pairs are generated in the memory cells, with the result that information memorized in the memory cells as existence or non existence of electrons or holes is falsified.

As in known, an error in information can occur due to the unfavourable influences of $\beta$ and $\gamma$ rays on the characteristics of the semiconductor elements, although the process of causing such information error due to the $\beta$ and $\gamma$ rays is different from that due to the $\alpha$ rays. $\beta$ rays are electrically charged particles and interact with semiconductor elements, and thus, increase a leak current of, for example, bipolar semiconductor elements. In addition, $\gamma$ rays cause the threshold voltage of MOS-FETs, which are also semiconductor elements, to change.

The error of the information caused by the radioactive ray emission is referred herein to as a soft error. The soft error occurring during the operation of the semiconductor memory device, is detrimental to the reliability of the stored information.

SUMMARY OF THE INVENTION

It is an object of the present information to provide a structure of a semiconductor device which can prevent soft error.

In accordance with the object of the present invention, there is provided a semiconductor device comprising:

an LSI chip provided with semiconductor elements on one surface thereof;

a carrier for mounting the LSI chip in a space within the carrier, and;

a cover for hermetically enclosing the LSI chip within the carrier, said cover being rigidly connected to the carrier by a sealing material, characterized in that, a plate having a shielding effect against radioactive rays is arranged in the space defined by the cover and the carrier, so that said plate confronts the semiconductor elements.

BRIEF DESCRIPTION OF THE DRAWINGS

The present invention is hereinafter explained in detail with reference to FIGS. 1 through 4, wherein.

DETAILED DESCRIPTION OF THE PREFERRED EMBODIMENTS

Figure 1:
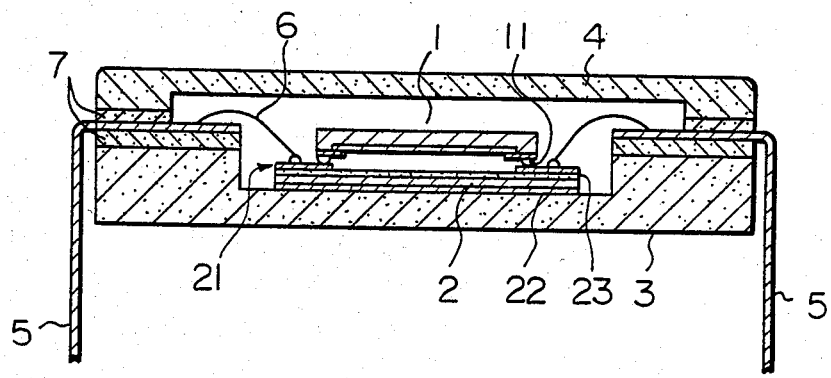
FIG. 1 is a cross sectional view of a semiconductor device according to an embodiment of the present invention.
Figure 2:
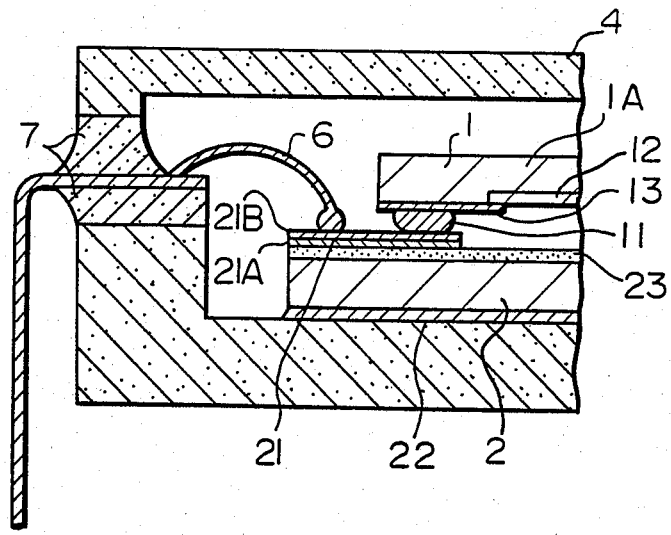
FIG. 2 is a partially enlarged view of FIG. 1.

The semiconductor device illustrated in FIGS. 1 and 2 comprises an LSI chip 1 which is provided with semiconductor elements, such as memory cells 12 made of a plurality of one MOS FET transistor-one capacitor elements, bit lines (not shown), work lines (not shown) and peripheral circuit elements (not shown). The LSI chip provided with these semiconductor elements is known for example from U.S. Pat. No. 4,156,939. These semiconductor elements are formed at a surface region of the LSI chip and are selectively covered by a not shown insulating film, such as a phosphosilicate glass film.

A carrier 3, which is a part of the package, is used for mounting the LSI chip 1 in a space therein and is made of a ceramic material which may contain such a concentration of radioactive elements as will cause emission of radioactive rays and thus soft error. A cover 4, which is another part of the package, hermetically encloses the LSI chip 1 within the carrier and is usually made of a ceramic material, which may have the same type of concentration of radioactive elements as mentioned above.

In the semiconductor device illustrated in FIGS. 1 and 2, a plate having a shielding effect against radioactive rays, hereinafter simply referred to as a shield plate, is denoted by reference numeral 2. The shield plate 2 is located between the carrier 3 and the LSI chip 1, in such a manner that the shield plate 2 supports the LSI chip and shields the semiconductor elements from radioactive rays. The shield plate 2 is preferably made of silicon, because high purity silicon which blocks the concentrations of radioactive rays that cause soft error is readily available as a semiconductor material. An epoxy or polyimide resin may also be used for the shield plate 2. Metals, such as aluminum, molybdenum and tungsten, will be suitable for use as the shield plate 2, if a high purity of 99.99999% or preferably 99.9999999% is attained in these metals in the future. The purity of the metal for the shield plate may, however, be lower than the value mentioned above, when the integration degree of memory cells in the LSI chip is low, for example 32 K bits. The material of the shield plate should have an expansion coefficient approximately equal to that of the LSI chip and the carrier. Any material having such an expansion coefficient and an extremely low concentration of radioactive elements can be used for the shield plate. In this regard, silicon is more preferable than epoxy or polyimide resin from the point of view of its expansion property.

In the semiconductor device having the structure as explained above, memory cells 12 are interposed between a semiconductor substrate 1A of the LSI chip and the shield plate 2 of, for example, semiconductor silicon. Accordingly, although the conventional ceramic material of the cover and carrier may emit radioactive rays, the memory cells can be completely shielded against radioactive rays moving in the package. The reliability of the semiconductor device is, therefore, enhanced by the present invention, even though conventional ceramic materials are used for the carrier and cover. This is because information stored in the memory cells by the existence or non existence of electrons or holes, is not destroyed by radioactive rays.

The back surface of shield plate 2 is fusion-bonded to the carrier 3 by a gold-silicon solder 22. On the top surface of the shield plate 2, there are formed conductor leads 21 which are thermally pressure-bonded to gold pads 11. The LSI chip 1 is supported via the gold pads 11 and conductor leads 21 by the shield plate.

As mentioned above, the memory cells 12 are shielded by the shield plate 2 from radioactive rays emitted from the carrier 3. In this regard, the surface area of the shield plate 2 must be larger than that of the LSI chip 1. The thickness of the shield plate 2 is usually from 320 to 490 microns.

The semiconductor device illustrated in FIGS. 1 and 2 is provided with leads 5 and a low melting point glass 7 for rigidly securing the leads 5. The low melting point glass 7 may contain such a concentration of radioactive elements as could cause soft error. The inner extremity of each lead 5 is connected to one end of a wire 6 and the other end of the wire 6 is connected to one of the conductor wires.

An insulating film 23 consisting of silicon dioxide or silicon nitride is formed, as illustrated in FIG. 2, on the top surface of the shield plate made of, for example, high purity silicon. The conductor leads 21 are formed on the insulating film 23 and consist of plurality of thin films, for examples, two films, illustrated in FIG. 2 as an upper film 21B and a lower film 21A. Preferable thin films are titanium, nickel and gold films or chromium, copper and gold films vapor-deposited successively on the insulating film 23.

Figure 5:
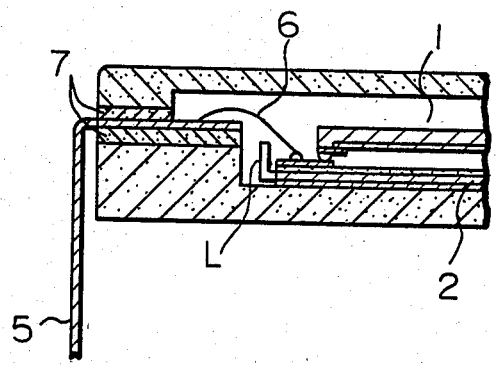

Although the shield plate 2 illustrated in FIGS. 1 and 2 is a flat plate, the shield plate 2 may include a lug or protruding part along the periphery thereof, so that radioactive rays emitted laterally from the inner wall of the carrier 3 can be shielded by the lug. The shield effect of the shield plate having the lug is higher than that of the flat shield plate. FIG. 5 shows such a lug L on the perimeter of the shield plate.

Figure 3:
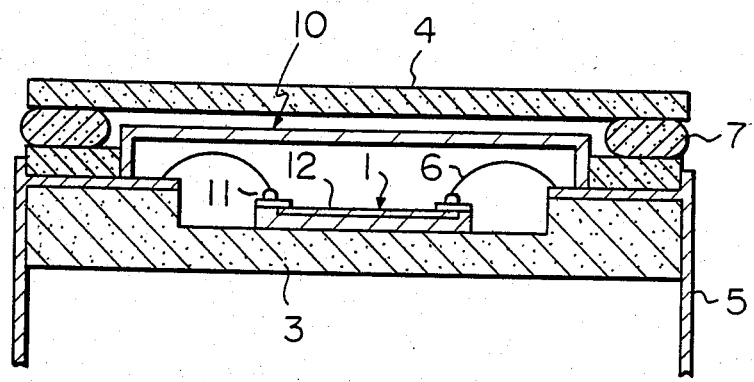
FIG. 3 is a cross sectional view of a semiconductor device developed by the assignee of the subject application.

In FIG. 3 the same parts of the semiconductor device illustrated in FIG. 1 are denoted by the same reference numerals. The shield plate is, however, denoted not by the reference numeral 2 but 10.

Referring to FIG. 3, the shield plate 10 is located between the cover 4 and the LSI chip 1 and covers the memory cells 12 of the LSI chip 1. The shield plate 10 is inserted into the space in the carrier 3 and is held tightly in position by the walls of the space of carrier 3. The radioactive rays emitted from the cover 4 cannot pass through a body 10A of the shield plate 10 (FIG. 4) and, therefore, the memory cells are shielded against such radioactive rays. In addition, since the shield plate 10 is provided with leg parts 10B (FIG. 4) which vertically extend from the body 10A thereof, the memory cells are shielded against the radioactive rays emitted from the low melting point glass 7 used for sealing. The leg parts 10B are secured to the inner wall of the carrier in such a manner that the leads 5 which electrically connect the memory cells to an electronic device outside the semiconductor device, are partly exposed at the space defined by the inner surface of the shield plate.

Figure 4:
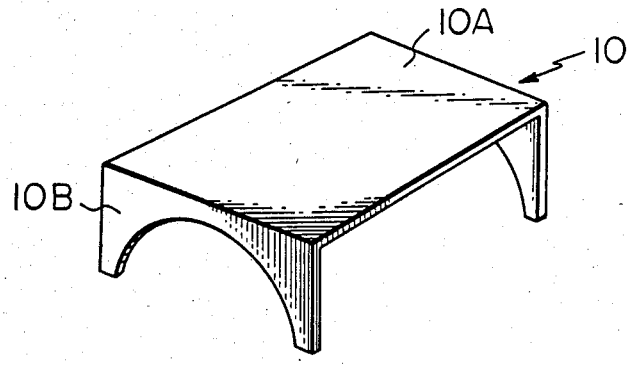
FIG. 4 is a perspective view of a plate having a shielding effect used in FIG. 3; and, FIG. 5 is a modification of the FIGS. 1 and 2 embodiment.

Although the leg parts 10B illustrated in FIG. 4 have a recess, such recess may be omitted and the leg parts can be made of rectangular plates. However, when the shield plate is semiconductive or electrically conductive, the leg parts 10B of the shield plate preferably have a recess large enough for the portions of the leads 5 within the package to protrude from the recess without contact between the leads 5 and the shield plate. When the shield plate 10 is made of a high purity silicon, the inner surface of the shield plate may be provided with an insulating film of silicon dioxide or silicon nitride, so as to prevent current conduction from the wires 6 to the shield plate 10 which may be in contact with the wires 6. When the leg parts of the shield plate made of high purity silicon are in the form of rectangular plates, the insulating film may be formed on the parts of the shield plate which come into contact with the wires. The shield plate is preferably made of such metals having a high purity as aluminum, Kovar, 42 alloy (42% Ni-Fe alloy) and molybdenum. When the shield plate is made of a metal, the insulating film mentioned above is necessary to prevent current conduction.

The shield plate may be made of resin film having a thickness of approximately 100 microns, which is sufficient for preventing the transmission of radioactive rays.

In order to secure the shield plate to the inner wall of the carrier, a solder may be used. However, since the solder material can emit radioactive rays, the shield plate must be carefully soldered so that the solder is shielded by the shield plate.

I claim:

1. A semiconductor device comprising:
   a LSI chip provided with semiconductor elements on one surface thereof;
   a non-conductive carrier for mounting said LSI chip in a space within the carrier;
   a cover for hermetically enclosing said LSI chip within the carrier, said cover being rigidly connected to the carrier by a sealing material; and
   a shield plate having such a high purity that any radioactive rays emanating therefrom do not cause soft error, and being arranged in the space between said LSI chip and said carrier, so that said shield plate confronts said one surface of said LSI chip and supports said LSI chip, the surface area of said shield plate being larger than the surface area of said one surface of said LSI chip.

2. A semiconductor device according to claim 1, wherein said shield plate is provided with conductor leads on a surface confronting said semiconductor elements.

3. A semiconductor device according to claim 2, wherein said LSI chip is supported by said shield plate via said conductor leads and by pads formed on the surface of the LSI chip confronting said shield plate.

4. A semiconductor device according to claim 1, wherein said shield plate includes a lug along the periphery thereof, so that the radioactive rays emitted laterally from an inner wall of said carrier can be shielded by said lug.

5. A semiconductor device according to claim 1, 2, 3 or 4 wherein said shield plate is made of a high purity silicon.

6. A semiconductor device according to claim 1, 2, 3 or 4 wherein said shield plate is made of a high purity metal.

7. A semiconductor device according to claim 1, 2, 3 or 4 wherein said semiconductor elements comprise memory cells which store information by the existence or non existence of electrons or holes in the memory cells.

8. A semiconductor device according to claim 1, wherein said shield plate consists of high purity silicon having a purity identical to that of semiconductor material.

9. A semiconductor device according to claim 1, wherein an insulating material film is formed on the inner surface of said shield plate.

* * * * *